United States Patent [19]
Federl

[11] Patent Number: 5,950,181
[45] Date of Patent: Sep. 7, 1999

[54] APPARATUS AND METHOD FOR DETECTING AND ASSESSING A SPATIALLY DISCRETE DOT PATTERN

[75] Inventor: Peter Federl, Regensburg, Germany

[73] Assignee: Siemens Aktiengesellschaft, Munich, Germany

[21] Appl. No.: 08/779,365

[22] Filed: Jan. 6, 1997

[30] Foreign Application Priority Data

Jan. 4, 1996 [DE] Germany ............................ 96 100 070

[51] Int. Cl.[6] ................................................... G06F 15/18
[52] U.S. Cl. ................................ 706/15; 706/16; 706/20; 706/27; 706/916
[58] Field of Search ................................ 706/15, 16, 20, 706/25, 26, 27, 40, 916

[56] References Cited

U.S. PATENT DOCUMENTS

| | | | |
|---|---|---|---|
| 5,301,257 | 4/1994 | Tani | 706/20 |
| 5,333,147 | 7/1994 | Nohara etal. | 375/224 |
| 5,787,190 | 7/1998 | Peng et al. | 382/145 |

FOREIGN PATENT DOCUMENTS

| | | | |
|---|---|---|---|
| 0 447 995 A3 | 9/1991 | European Pat. Off. | G06F 11/22 |
| 0 633 536 A1 | 1/1995 | European Pat. Off. | G06F 17/00 |

OTHER PUBLICATIONS

"Fast Automatic Failbit Analysis for DRAMs" (((Malzfeldt et al.), IEEE 1989, paper 20.1, pp. 431–438.

*Primary Examiner*—Tariq R. Hafiz
*Assistant Examiner*—Jason W. Rhodes
*Attorney, Agent, or Firm*—Herbert L. Lerner; Laurence A. Greenberg

[57] ABSTRACT

In an apparatus and a method for detecting and assessing a spatially discrete dot pattern disposed in a multidimensional coordinate system, each dot in the pattern assumes at least two differentiable status values. A measuring device records the coordinate values and status values of each dot of the multidimensional spatial dot pattern. A memory stores data that correspond to the recorded coordinate values and status values of each dot of the multidimensional spatial dot pattern. A computer into which the stored data are entered and in which a coordinate counter for each coordinate value of a coordinate axis is determined from the stored data, is associated with the memory. The value of the coordinate counter is formed from the number of detected dots of the coordinates that have a predetermined status value. A neural network is associated with the computer. An n-dimensional input vector with components formed from the calculated coordinate counters of each dot of the spatially discrete dot pattern is entered in the neural network. The neural network calculates an output vector by comparing the calculated input vector of the measured dot pattern with stored set-point vectors obtained on the basis of exemplary dot patterns. The neural network assigns a classification value of the measured dot pattern from the output vector ascertained and outputs it.

24 Claims, 8 Drawing Sheets

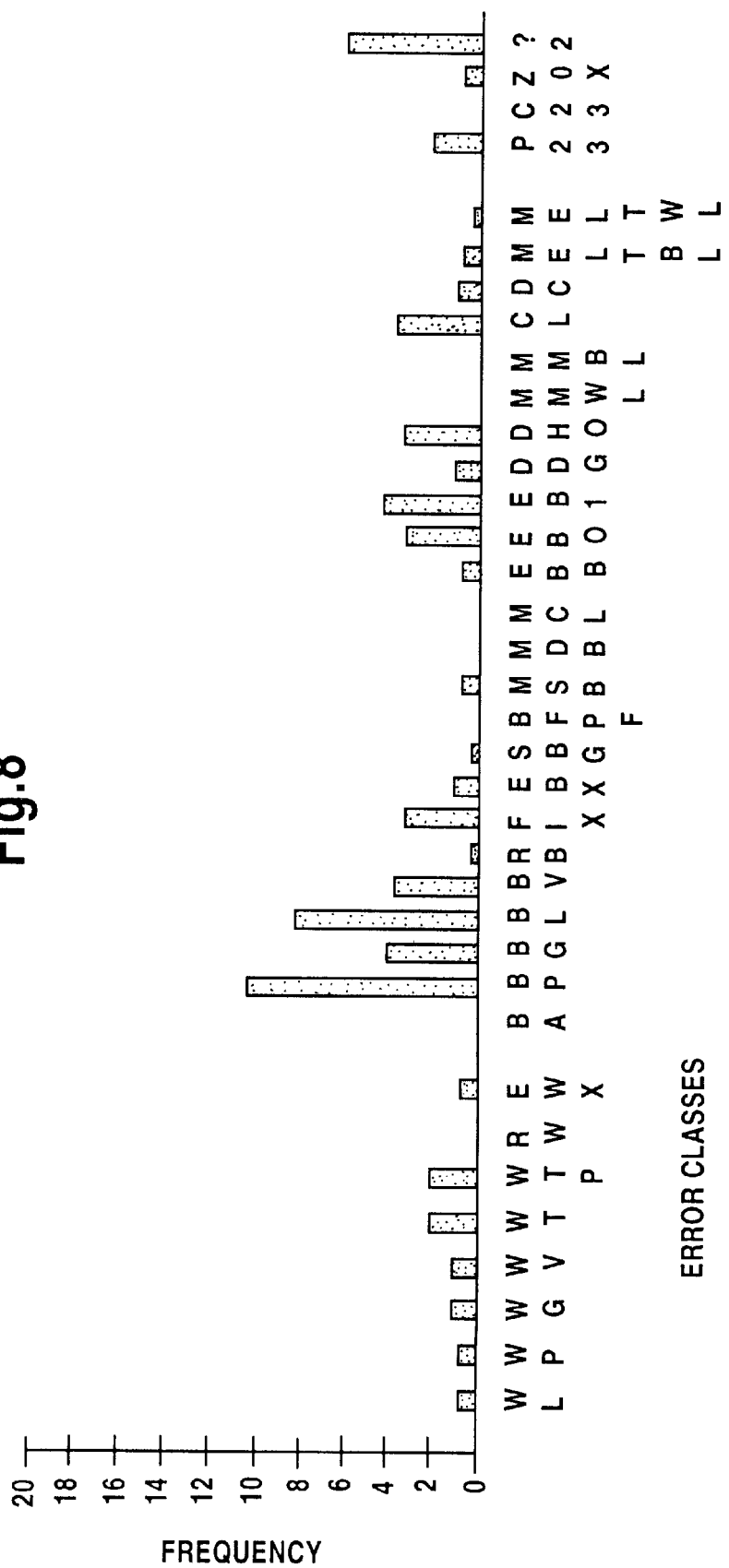

APPARATUS AND METHOD FOR DETECTING AND ASSESSING A SPATIALLY DISCRETE DOT PATTERN

BACKGROUND OF THE INVENTION

Field of the Invention

The invention relates to an apparatus and a method for detecting and assessing a spatially discrete dot pattern disposed in a multidimensional coordinate system, in which each dot in the pattern assumes at least two differentiatable status values. In particular, the invention relates to an apparatus and a method for recognizing and classifying a binary failure pattern of defective memory cells of a semiconductor memory.

The failure pattern of the memory cells of defective semiconductor memories provide clues to the technological problems that cause failures in the manufacture of semiconductor memories. Along with the purely statistical distribution of the failure patterns on a wafer, which as a rule is an indication of particle problems in certain chip production processes, non-statistical distributions of the failure patterns on a wafer in particular, after evaluation, provide suitable clues to systematic technological and process problems. In order to allow sufficiently statistically well-founded conclusions to be drawn about such problems, it is necessary that the failure patterns of individual semiconductor chips or distributions of the failure patterns over an entire silicon wafer be recognized and classified. One difficulty, among others, in that respect is that failure patterns can occur in the most variant and ever-changing forms. Moreover, the amounts of raw data obtained by chip testing systems and used as a basis for analysis are enormous. In a dynamic semiconductor memory chip with a memory size of 4 megs, for instance, if failed pure "0" cells, pure "1" cells and performing an OR operation on "0"-and-"1" cells are taken into account, the amount of raw data in the least favorable case is 4 megabits·3=12 megabits. As a result, the number of theoretically conceivable variants of failure patterns for a 4-megabit memory is $2^{4194301}-1$, which is a number with approximately 1.2 million digits. An attempt is made to organize that nearly infinitely large number of failure patterns with the aid of so-called bitmaps, which represent patterns of nonfunctioning memory cells. Although a classification system with about 80 to 100 failure classes is feasible because of the similarity of the bitmaps that are obtained, nevertheless in manual assessment by a human operator, visual error analysis of all of the failure patterns of a typical wafer which is 6 inches in diameter takes about 15 hours. The attempt has been made to automate the analysis of the failure patterns with conventional methods by using a computer. However, the results prove to be unsatisfactory in the extreme, since on one hand important error classes of failure patterns are not caught by the computer and require manual reprocessing by a skilled professional, and on the other hand the analysis times in the previous methods, even using the most modern computer equipment with high computation speeds, are still too long. Thus it is hardly practicable, for relatively large semiconductor memories with a capacity of 4 megs and more, to use the analysis methods employed heretofore. In the methods used until now, because of the long computation time needed to analyze memory chip failure patterns, only samples of individual wafers or memory chip modules were taken from ongoing production and measured separately by using a special analysis program. After preprocessing of the data in a data memory especially intended for that purpose ("fail memory") in the measuring apparatus, the preprocessed data were transmitted as a raw data file from the measuring apparatus to a computer and there subjected to a primary analysis performed with a conventional programming technique. Another major disadvantage of that kind of procedure was that upon a transition to a new generation of memories, considerable portions of the preanalysis and primary analysis had to be reprogrammed. New types of failure patterns to be analyzed also had to be newly programmed, at great effort and expense.

SUMMARY OF THE INVENTION

It is accordingly an object of the invention to provide an apparatus and a method for detecting and assessing a spatially discrete dot pattern, in particular such as a failure pattern on a semiconductor chip, which overcome the hereinafore-mentioned disadvantages of the heretofore-known apparatuses and methods of this general type and which make an automatic, highly reliable and replicable analysis and classification of the dot pattern possible with usable analysis times, even when there is a considerable number of dots, in particular in the range of more than 1 meg.

With the foregoing and other objects in view there is provided, in accordance with the invention, an apparatus for detecting and assessing a spatially discrete dot pattern disposed in a multidimensional coordinate system, in which each dot in the pattern assumes at least two differentiatable status values, the apparatus comprising a measuring device for recording coordinate values and status values of each dot of a multidimensional spatial dot pattern; a memory associated with the measuring device for storing data corresponding to the recorded coordinate values and status values of each dot of the multidimensional spatial dot pattern; a computer associated with the memory for receiving the stored data, for determining a coordinate counter for each coordinate value of a coordinate axis from the stored data, and for forming a value of the coordinate counter from a number of detected dots of coordinates having a predetermined status value; and a neural network associated with the computer for receiving an n-dimensional input vector with components formed from the calculated coordinate counters of each dot of the spatially discrete dot pattern, for calculating an output vector by comparing the calculated input vector of the measured dot pattern with stored set-point vectors obtained on the basis of exemplary dot patterns, and for assigning a classification value of the measured dot pattern from the ascertained output vector and outputting the classification value.

With the objects of the invention in view there is also provided a method for detecting and assessing a spatially discrete dot pattern disposed in a multidimensional coordinate system, in which each dot in the pattern assumes at least two differentiatable status values, the method which comprises recording coordinate values and status values of each dot of a multidimensional spatial dot pattern with a measuring device; storing in a memory data corresponding to the recorded coordinate values and status values of each dot of the multidimensional spatial dot pattern; entering the stored data in a computer associated with the memory; determining a coordinate counter for each coordinate value of a coordinate axis from the stored data with the computer, and forming a value of the coordinate counter from a number of detected dots of the coordinates having a predetermined status value; forming n components of an n-dimensional input vector from the calculated coordinate counters of each dot of the spatially discrete dot pattern; entering the n-dimensional input vector into a neural network; calculating and outputting an output vector with the neural network by comparing the calculated input vector of the measured dot pattern with stored set-point vectors obtained on the basis of exemplary dot patterns; and assigning and outputting a classification value of the measured dot pattern from the output vector ascertained with the neural network.

According to the invention, it is provided that the analysis of the spatially discrete dot pattern is performed by a neural network which is implemented in a computer, to which an n-dimensional input vector with n components is presented for analysis, and which by comparing the input vector with stored set-point vectors obtained on the basis of exemplary dot patterns, calculates an output vector that outputs a classification value of the measured dot pattern on the basis of the output vector ascertained for classification of the dot pattern.

In accordance with another feature of the invention, the neural network is a configuration of interlinked processing elements, so-called neurons, which are disposed in a hierarchical structure with a plurality of layers. Each neuron can have one or more inputs, and as a rule it has only one output. The neural network that is preferably used includes three different layers: an input layer assigned to the input vector, an output layer assigned to the output vector, and a hidden layer located between the input layer and the output layer and assigned to the set-point vectors. The number of neurons in the calculation layer depends, among other factors, on the complexity of the neural network for the recognition of dot patterns presented to it, on the desired information capacity of the networks, on the number and extent of skills of the trained neural network for handling unknown patterns, and on the number of iterations that the neural network performs in the training phase in order to make all the desired network directions and basic values available.

In the mode of operation of the neural network, one differentiates between two procedures to be performed in succession: First, the training on the basis of exemplary dot patterns with known outputs, and second, the actual procedure of recognizing unknown patterns.

In the training of the neural network, predetermined input data patterns, the so-called exemplary dot patterns, are presented to the network in succession. The values of the neural basic values in the neural network are set in such a way that the output of the network, for each individual training pattern, approximately agrees with a desired corresponding network output (target vector or output vector) for the corresponding pattern. Once training is completed, all of the basic values are fixed at their current values.

Next, the neural network can in principle be used to recognize unknown patterns. In pattern recognition, the input vectors obtained from the unknown patterns by algorithmic preprocessing are applied in succession at the inputs of the network, and correspondingly resultant network responses are output by the output nodes.

In accordance with a further feature of the invention, the neural network has a configuration of the restricted Coulomb energy network type. The term "restricted Coulomb energy" refers to an energy function on the basis of an electrostatic potential. The designation "RCE network" is a registered trademark of Nestor, Inc., an enterprise of the Nobel prize winner L. N. Cooper. A neural network of the RCE type has precisely three layers: an input layer, a hidden layer, and an output layer. The hidden layer is entirely connected to the input layer. The output layer is also partly connected to the hidden layer. The reason for this is that different types of processing elements are used in the hidden layer and in the output layer. In comparison to neural networks of the Kohonen type or Perceptron type, RCE networks run very fast and efficiently, because of their simpler configuration. The neural network is trained as follows. First, in this type, the input layer of the neural network is presented with an n-dimensional input vector, obtained by preprocessing from an exemplary dot pattern of a known class, wherein the input vector represents a target dot in an n-dimensional space. In the hidden layer, linked to the input layer, of the neural RCE network, an n-dimensional space region (hypersphere or hyperblock) is defined around the target dot of each input vector, with the target dot of the input vector as the center point of the n-dimensional space region. The volume of this space region is adjusted to suit the assigned class. All of the spatial dots inside this n-dimensional space region thus belong to the predetermined class that belongs to the respective exemplary dot pattern. This method is repeated with further input vectors that belong to further classes. After the presentation of these further input vectors, the neural network decides whether or not an input vector belonging to a certain class is located inside the space region of an input vector that belongs to a different class. If so, then the corresponding space regions are changed, by geometrical adaptation or contraction, to such an extent that an input vector belonging to a certain class does not come to be located inside the space region of an input vector belonging to a different class, and it can moreover be entirely possible for some of the space regions, and even such different classes, to overlap one another in some regions. Preferably, hyperblocks are used to form the n-dimensional space regions, which unlike the use of hyperspheres as space regions of a certain class has the advantage that in the event of an adaptation of the space regions, not every dimension has to be made smaller. If hyperspheres are used, the decrease in volume of the space region in the event of a contraction is always greater than with hyperblocks. Thus the option of generalizing, which is an important property of neural networks, is less favorable than in the case of blocks.

One advantage of RCE networks is also generally that they are automatically configured during the training procedure. The training procedure combines configuration and learning by using the high-order algorithm. Accordingly, the number of hidden units in the hidden layer of the neural network is automatically defined. Along with the definition of new exemplary patterns, the size or extent of the space regions can also be adapted more easily through the use of the training procedure.

One essential characteristic of the invention is that what is offered to the neural network is not the original, physically measured coordinate values and status values of each dot of the multidimensional spatial dot pattern, but instead first coordinate counters or coordinate projections for each coordinate value of a coordinate axis are calculated from the original data and the value of the coordinate counter is calculated from the number of dots detected in the dot pattern of the corresponding coordinates having a predetermined status value. The actual pattern recognition through the use of the neural network takes place on the basis of the coordinate counters being ascertained. In this way, the amounts of raw data occurring in the recording of the coordinate values and status values of each dot on the part of the measuring device are compressed considerably. For example, in the analysis of the failure patterns of a 4-megabit semiconductor chip, instead of the 4 megabits·3= 12 megabits of raw data, the amount of data is now only (1024+256)·3·16 data words of 16 bits each, or in other words barely 1 megabit. Thus in this example, only one-twelfth as much data is transmitted from the measuring device to the computer, as compared with a complete transmission of the dot pattern data. This reduction in data quantity does involve a loss of information, which occurs especially whenever more than one status value of a coordinate, such as a single dot defect (in the case of a semiconductor memory, an electrical failure, in which both the X and Y coordinates are in principle known) is located inside a certain region of the dot pattern. In such cases, although the type of error (such as word/bit line crossing, single-bit, cluster, etc.) can be unambiguously ascertained, still the precise X and Y coordinates in the physical block of the semiconductor memory cannot. However, this problem does not arise in only word-line-oriented or only bit-line-oriented failures.

In accordance with the principle of the invention, in order to further reduce the quantity of data, the neural network is presented not, for instance, with the coordinate counters as the input vectors directly, but instead with an n-dimensional input vector, where the number n is typically on the order of magnitude of about 10 to about 30, and where the n components of the input vector are obtained from the values of the coordinate counters of the spatially discrete dot pattern by a number of subprocedures.

In accordance with another feature or mode of the invention, the components of the n-dimensional input vector can be assigned the following numerical values, which are derived directly from the coordinate counters of the spatially discrete dot pattern:

a deviation from the center of distribution of the coordinate counters of the spatially discrete dot pattern of dots having a predetermined status value in the direction of a specific coordinate axis, and/or a parameter for a global monotonous distribution of partial regions of the dot pattern with dots having a predetermined status value, and/or a parameter for the periodicity of dots having a predetermined status value, and/or a second moment of the mass distribution of dots of the dot pattern having a predetermined status value, and/or a proportion of coordinate values having more than a predetermined number of dots of the dot pattern having a predetermined status value, and/or a proportion of echo dots of dots of the dot pattern having a predetermined status value, and/or a parameter of the fluctuations of dots of adjacent coordinate values of the dot pattern having a predetermined status value, and/or a proportion of coordinate values having fewer than a predetermined number of the corresponding coordinates of dots of the dot pattern having a predetermined status value, and/or an equidistance of dots of the dot pattern having a predetermined status value in a periodic partial region of the dot pattern, and/or a number of cohesive or at least partially cohesive partial regions of dots of the dot pattern having a predetermined status value in predetermined coordinate directions.

In accordance with a further feature or mode of the invention, the numerical values assigned to the n components of the n-dimensional input vector are normalized, in particular in the numerical range of numbers between −1 and +1.

In accordance with an added feature or mode of the invention, the multidimensional coordinate system of the spatially discrete dot pattern has orthogonal coordinate axes, in particular two orthogonal coordinate axes, and the value of each coordinate counter is formed by adding up the detected dots of each coordinate having a predetermined status value and projection onto the corresponding orthogonal coordinate axis, in particular a column axis and a row axis.

In accordance with an additional feature or mode of the invention, the dot pattern represents the failure pattern of a physically cohesive block of memory cells of a semiconductor memory including a plurality of semiconductor memories constructed on the main surface of a semiconductor wafer.

In accordance with yet another feature or mode of the invention, each failure cell of the failure pattern has one of three status values, of which one status value is assigned to a "0" failure of the memory cell, one status value is assigned to a "1" failure of the memory cell, and one status value is assigned to a "0"-and-"1" failure of the memory cell.

In accordance with yet a further feature or mode of the invention, the memory cells of the semiconductor memory constructed on the main surface of the semiconductor wafer are disposed in a matrix in bit lines or columns and in rows or word lines, and the coordinate counters each represent one column counter and one row counter.

In accordance with a concomitant feature or mode of the invention, the components of the n-dimensional input vector are assigned the following numerical values:

a deviation from the center of distribution of failure cells of a physical block of the semiconductor memory having a predetermined fail status in the bit line and/or word line direction; and/or a second moment of the mass distribution of failure cells of a physical block of the semiconductor memory with a predetermined fail status in the bit line and/or word line direction; and/or a parameter for a global monotonous distribution of failure cells of a physical block of the semiconductor memory having a predetermined fail state; and/or a parameter for the periodicity of the fail pattern of failure cells of a physical block of the semiconductor memory having a predetermined fail state; and/or a proportion of the bit lines and/or word lines of failure cells of a physical block of the semiconductor memory having a predetermined fail state with more than one specified first limit value on the affected row; and/or a proportion of bit lines and/or word lines of failure cells of a physical block of the semiconductor memory having a predetermined fail state with more than one specified second limit value on the affected row, wherein the affected word lines and/or bit lines have an echo in adjacent physical blocks; and/or a parameter for the fluctuations of failure cells of a physical block of the semiconductor memory having a predetermined fail state between adjacent bit lines and/or adjacent word lines; and/or a proportion of bit lines and/or word lines having failure cells of a physical block of the semiconductor memory with a predetermined fail state with fewer than a third limit value of failure bits on the affected word line and/or bit line; and/or a parameter for the equidistance of failure-tainted bit lines and/or word lines having a periodic pattern;

a parameter for the number of larger groups of failure cells in the bit line and/or word line direction; and/or a proportion of bit lines and/or word lines which have intermediate-layer short circuits in the bit line and/or word line direction; and/or a total number of failure cells; and/or a parameter for failure cells occurring at an increased rate on the peripheral region of the wafer; and/or a ratio between longer failure-tainted word lines and/or bit lines in the bit line and/or word line direction.

The invention makes use of a neural network to enable reliable classification of memory chip failure patterns that can also be performed parallel, along with the usual function tested memory chips, during a standard reduction measurement. The preprocessing algorithm for furnishing the input data for the neural network, and the neural network itself, are scalable and this enables the use of the software employed at a transition from one chip generation to the next without having to reprogram the software. Moreover, qualitatively newly occurring failure patterns can be taken into account in a simple way by simple training, that is learning from an exemplary dot pattern, without requiring a change of the program running in the computer. In order to implement the analysis program, an economical computer can be used, such as a commercially available personal computer (PC), which is connected to the computer or microprocessor of the chip testing system through an interface card, for instance. It is thus also possible, by parallel execution of the data and address bus system, over which the microprocessor of the chip testing system communicates with the fail memory of the testing system, to read the failure pattern in the fail memory into the PC interface card parallel to the processing of the failure pattern in the chip testing system in the separately disposed PC and to further process it there. In contrast to conventional failure pattern analysis, the further processing is performed in this case not, as before, by algorithmic breaking down of the failure patterns using conventional programming techniques but rather by extraction of characteristic features from the failure patterns and presenting these characteristics as an input vector for a neural network that then takes on the task of classifying the failure patterns. The invention then also offers the advantage of not performing the actual pattern recognition task on very expensive chip testing systems but rather on PC hardware which by comparison is quite economical. The chip testing systems or the measuring device can by comparison then be used according to the invention exclusively for fast raw data acquisition.

Other features which are considered as characteristic for the invention are set forth in the appended claims.

Although the invention is illustrated and described herein as embodied in an apparatus and a method for detecting and assessing a spatially discrete dot pattern, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 is a bar graph plotted as a result of an assessment of classes of failure patterns that occur on a wafer.

DESCRIPTION OF THE PREFERRED EMBODIMENTS

Figure 1:
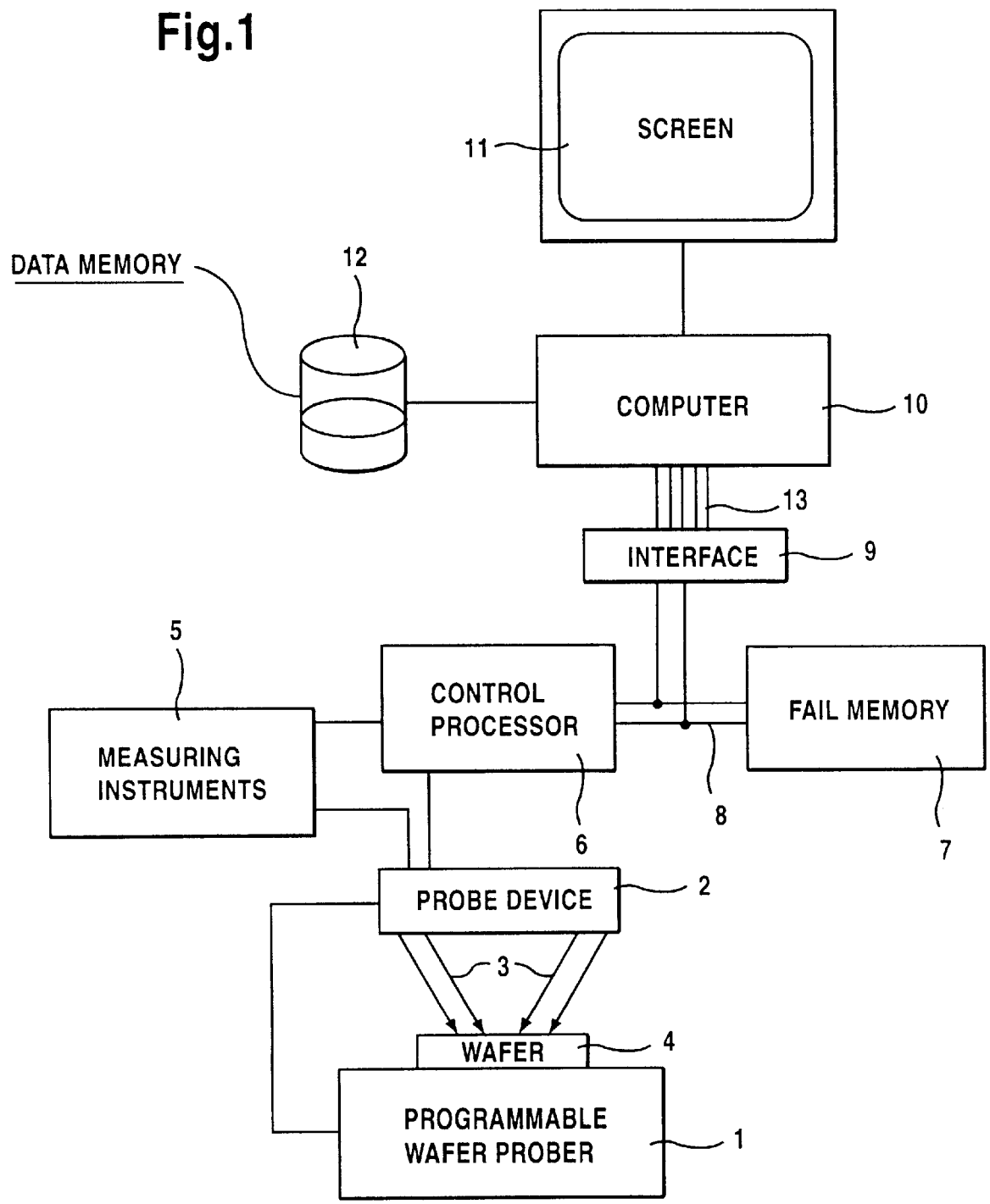
FIG. 1 is a block diagram of an exemplary embodiment of the apparatus according to the invention.

In the drawings, a preferred exemplary embodiment of the invention is shown in which failure patterns of memory cells of a defective dynamic semiconductor memory of a 4-megabit type are being examined. It is understood that the invention is readily applicable for analyzing larger semiconductor memories, for instance 16-megabit, 256-megabit and more. Special details will be described separately at various points in the ensuing description as needed.

The illustrated exemplary embodiment corresponds to an automated pattern recognition system of the kind used in megabit chip manufacture. Referring now to the figures of the drawings in detail and first, particularly, to FIG. 1 thereof, there is seen a block diagram showing further details of a pattern recognition system of the invention. A programmable wafer prober 1 and a measurement probe device 2 associated with it and having measurement tips 3 are provided as components of an automatic parametric chip testing system for measuring DRAM memory components produced on a wafer 4. A plurality of measuring instruments 5 are connected to the measuring device for detecting and evaluating electrical properties of the memory components disposed on the wafer 4. In order to control the individual components of the measuring device, a control processor 6 is provided, to which a fail memory 7 is assigned in order to store and preprocess the data. The control processor 6 of the measuring device communicates with the fail memory 7 through a data and address bus 8, to which an interface card 9 i s connected for passing raw data from the fail memory 7 over lines 13 to enter a separate computer 10 for further processing. The further processing of the raw data written into the computer 10 is not performed as before by algorithmic breakdown of the measured failure patterns using conventional programming techniques but rather by extraction of characteristic features from the failure patterns and presentation of these characteristics as an input vector for a neural network, constructed inside the computer 10, which then performs the classification of the entered failure patterns, as will be described in further detail below. A display device, such as a screen 11, is associated with the computer 10 for displaying the failure pattern analyzed by the computer 10 and the outcome of classification on the screen. The computer 10 is also assigned a data memory 12 for storing the raw data and the processed data.

The method of the exemplary embodiment can be roughly divided into four function units:

1. Measurement of the semiconductor chips of a wafer, processing of the measurement data, writing the measured raw data in the form of a raw data file into a computer, and preparation of the raw data for further analysis.
2. Performance of a first analysis of a defective physical block with respect to high-mass errors.
3. Performance of a second analysis of a defective physical block with respect to errors having a low error mass.
4. Checking whether or not significant distributions of individual error classes exist at certain wafer regions and simultaneously setting up an outcome data file.

The four function units will be described in further detail below.

Function unit 1: Measurement of the semiconductor chips of a wafer, processing of the measurement data, writing the measured raw data in the form of a raw data file into a computer, and preparation of the raw data for further analysis.

Figure 2:
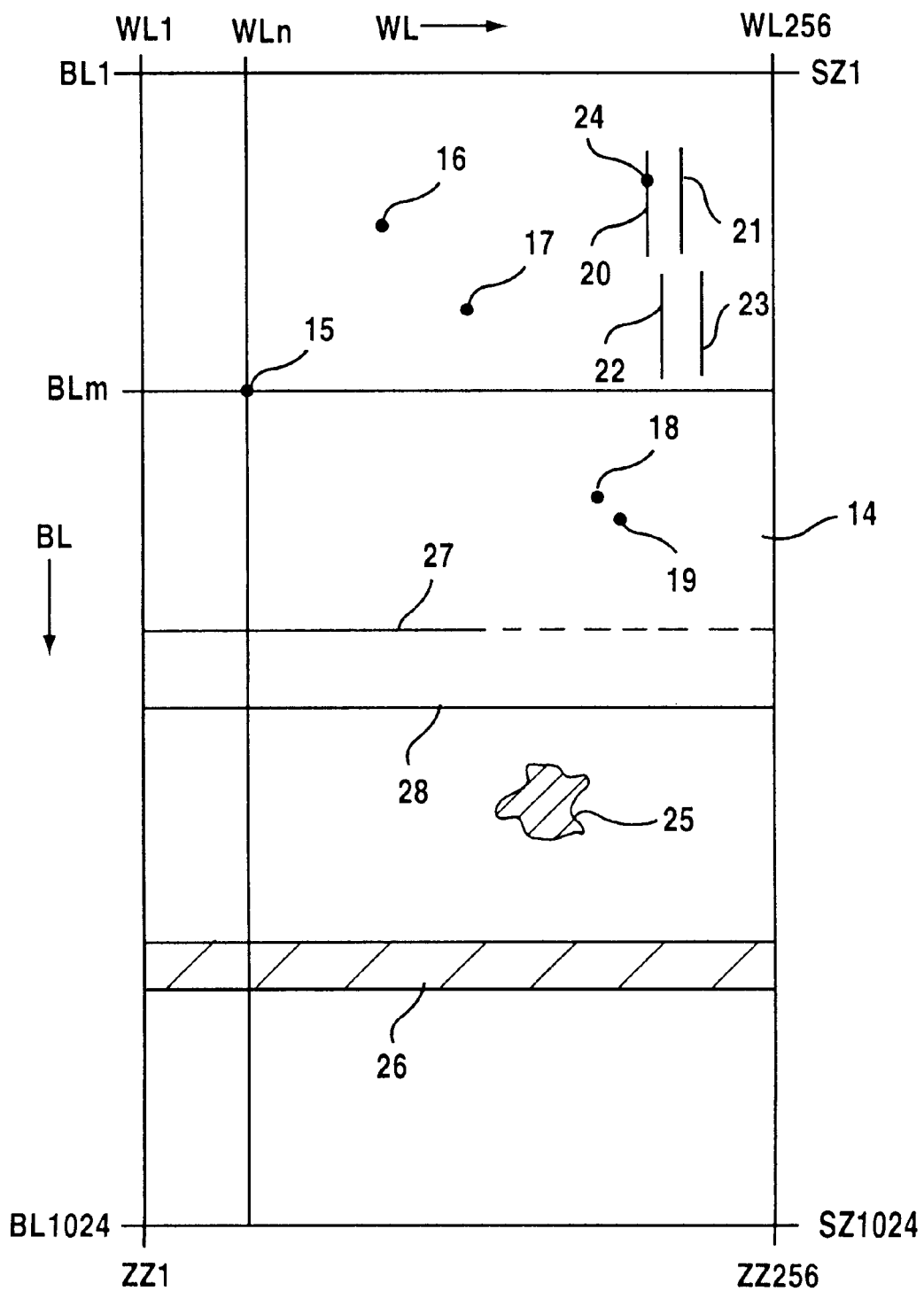
FIG. 2 is a diagrammatic illustration of failure cells in a plan view of a semiconductor memory constructed on a main surface of a silicon wafer, in which memory cells are disposed in a matrix of bit lines and word lines.

When measuring chip failures using the measuring device including the prober 1, the measurement probe device 2 with the measurement tips 3, the measuring instruments 5, the processor 6 and the fail memory 7, first X and Y coordinates of each individual chip on the wafer 2 from all of the semiconductor memory chips of the six-inch semiconductor wafer 2 as well as information about current-voltage values of the chips (for instance pass/fail information through an operation current or standby current, generator voltages and the like), are determined through the use of the measuring device, and for each chip the failure pattern and the failure rate, in other words the proportion of the total failure cells present, are measured. Even upon the measurement or preanalysis of the failure patterns of a semiconductor chip using the measuring device, each chip is divided into physically cohesive blocks, which are also called hexadecants in the 4-megabit memory, so that the actual pattern analysis is performed in this physical subunit. The analysis of the 4-megabit memory chip thus takes place by hexadecants. FIG. 2 shows a diagrammatic plan view of a physical block 14 of a semiconductor memory chip with 256 word lines WL1 to WL256 and 1024 bit lines BL1 to BL1024. The memory cells of the chips are each disposed at intersection points of one word line WLn and one bit line BLm. A physical block 14 thus includes a number of 256·1024=262, 144 memory cells. Some typically occurring configurations of defective memory cells are shown in FIG. 2. For instance, reference numerals 15, 16, 17 at the associated word/bit line intersection, indicate individually failed single cells (single-bit failures). Reference numerals 18 and 19 indicate immediately adjacently located failing individual cells (paired-bit failure). Reference numerals 20, 21, 22, 23 indicate failed memory cells located side by side on one portion of a word line. In the case of the word line failure 20, a separate single failure 24 with a different failure state than in the other failure cells of this word line 20 is also shown. Reference numeral 25 indicates an accumulation of side-by-side failure cells (a so-called cluster). Reference numeral 26 indicates a failure of a plurality of side-by side bit lines. Reference numerals 27 and 28 indicate failures of memory cells in a cohesive portion of a bit line or of the entire bit line.

The binary raw data file generated by the measuring device or the chip testing system with information for one wafer, or in the case of component measurements for one batch, that is a production-dictated cohesive group of a plurality of identical wafers, is written as a raw data file into the computer 10 through the lines 13 seen in FIG. 1. At the beginning of the raw data file is header information, such as batch number, wafer number, and associated structural type.

Next, the items of chip information follow in the order of the semiconductor chips being measured. An item of chip information includes a chip information clock, followed by 16 items of hexadecant information (for a 4-megabit semiconductor chip), or 512 items of segment information (for a 16-megabit semiconductor memory). The chip information clock indicates that the data for a certain chip will then follow, namely the X and Y coordinates of the chip on the wafer, along with items of technical information, such as information about current-voltage values of the chip. An item of hexadecant information indicates that the data for a new hexadecant then follow, specifically the hexadecant number (in the 4-megabit semiconductor memory) or the segment number (in the 16-megabit semiconductor memory), and these are followed by a number of 256 word line counters or column counters and 1024 bit lines counters or row counters for the total failure, and a corresponding number of coordinate counters for "0" failures and "1" failures. Previously, when the failure patterns of a chip were analyzed, all of the X and Y coordinates of the failure cells and the fundamental failure state were ascertained. By comparison, in the invention, for each physical block 14 of the semiconductor chip, a number of 256 row counters ZZ1 to ZZ256 and a number of 1024 column counters SZ1 to SZ1024 are ascertained, each of which includes the total of failure cells occurring on this row or column for each of the three failure states as information, along with the number of the associated row 1 through 256, or column 1 through 1024. The coordinate counters thus indicate the total values, projected onto the coordinates, of all of the failures having a certain failure state (that is, "0", "1", or "0" and "1") of the associated line ("projection"). In the present case, for each 4-megabit semiconductor chip to be analyzed with 256 row counters and 1024 column counters per hexadecant, a total data quantity, in the worst case of 16 defective physical blocks, becomes (1024+256)·3·16 data words with 16-bits, or in other words barely 1 megabit. Where a 16-megabit semiconductor memory is analyzed, the total cell field is divided into 512 segments each of 32 K (256 word lines counters and 128 bit line counters) which in a further processing step are recombined into 192 physically appropriate blocks.

On the basis of the organization and addressing of the 4-megabit memory chip, it is possible that failing lines in a predetermined hexadecant will have additional failures, so-called echoes, in a simultaneously selected second hexadecant of the same chip at the same address of the chip. The bit line addresses within both affected hexadecants are identical, while the word line addresses occur in mirror symmetry. In other words, the word line WL1 in the odd-numbered hexadecant corresponds with the word line WL256 in the next even-numbered hexadecant. In order to detect such errors with echoes, the data of each two corresponding hexadecants is jointly written into globally declared data structures and jointly prepared.

The most important global data structures, that is data structures referred to an entire wafer, are the following dynamically applied arrays. In the case of the 4-megabit semiconductor memory, they can be taken over directly from the hexadecant information of the raw data file, for the 16-megabit semiconductor memory they are assembled from the segment information while being suitably modified. The following explanations each refer to the 4-megabit chip but apply appropriately to a 16-megabit semiconductor memory as well. In order to adapt the analysis method of the invention to chip generations higher or lower than 4 megabits, all that is required is to vary a few global constants, which are defined in a predetermined program unit, and to adapt the program unit for generating the physical blocks from the column and row counters of the raw data file.

The raw data file thus includes the following items of information, among others:

256 row counters of the odd-numbered hexadecant for total failure;

256 row counters of the even-numbered hexadecant for total failure;

1024 column counters of the odd-numbered hexadecant for total failure;

1024 column counters of the even-numbered hexadecant for total failure;

derivations of the above data structures, conceived of as functions, once again involving dynamically applied arrays;

additional items of information for the individual elements of the respective column counters and row counters, which are stored, for instance, in a dynamically applied two-dimensional Boolean array. This additional information contains the following flag signals, for instance:

flg[x,1]=true means that line X fails both at "1" and at "0";

flg[x,2]=true means that line X fails predominantly at "0";

flg[x,3]=true means that line X fails predominantly at "1";

flg[x,4]=true means that line X has a 4-megabit-specific poly2-poly3 short circuit;

flg[x,5]=true means that line X has an echo in the corresponding hexadecants.

Echoes are looked for in this case only whenever the particular corresponding hexadecant is not a total failure, because then any failing word line and bit line projection would automatically have an echo in the other hexadecant, or whenever the various failure patterns are not overly chaotic in character. If a line in the corresponding hexadecant is recognized as an echo, then the line is eliminated from the central data structures, and the flag signal flg[x,5] of the line that is the cause for the echo is set to a value of "true". When eliminating lines, it should be taken into account that a failing bit line, for instance, in the word line projection is protected with the value "1" on each array element of the row counters of the even-numbered and odd-numbered hexadecants. Therefore, not only should the echo projection in the bit line direction be eliminated, but the 256 projections having the value "1" onto the word line projection should be eliminated in the echo hexadecant as well. The same is true for failing word lines. Since in principle every failing line, for instance in the bit line direction, simultaneously causes a so-called baseline in the other projection or in other words the word line projection, the knowledge of the base line widths in the two projection directions is a prerequisite for the elimination method. The baseline widths are determined before every elimination. Eliminations of lines are carried out only up to whichever is the current base line. The above comments on the echo problem are unnecessary if no echoes can occur, for instance because of the chip structure, or if there is no need or desire for other reasons to take echoes into account.

Figure 3A:
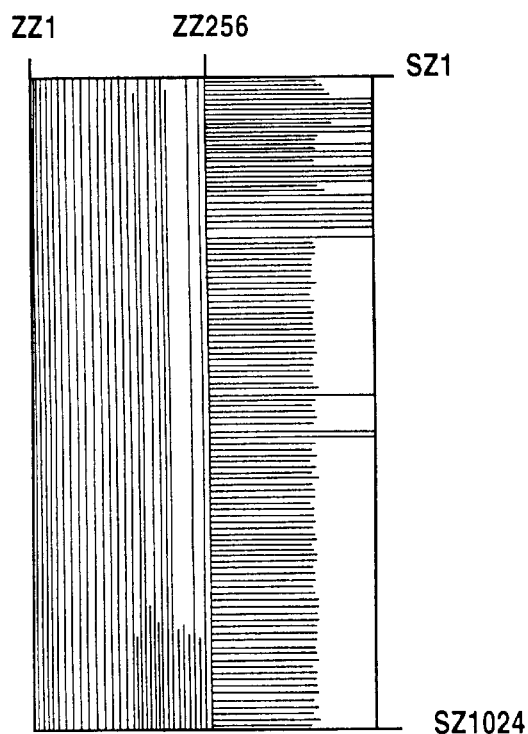
FIGS. 3A–3F are diagrammatic views of coordinate counters of typically occurring failure patterns of the memory cells of a physical block, in which bit line counters are plotted on a right-hand portion and word line counters on a left-hand portion of each drawing figure.
Figure 3B:
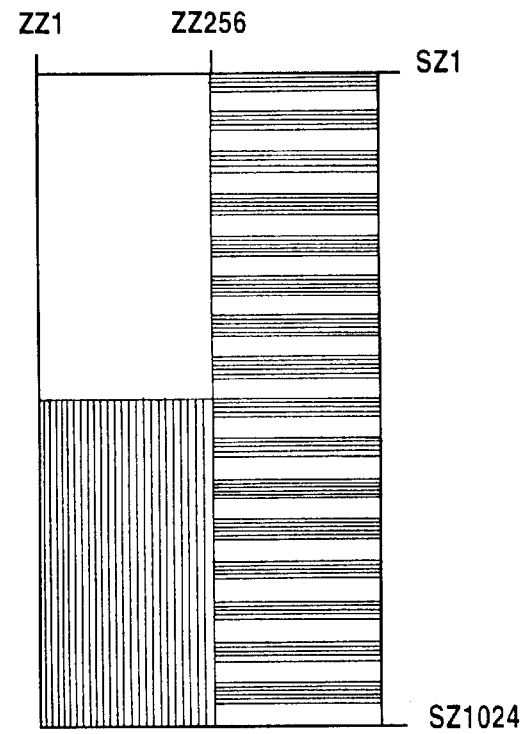
Figure 3C:
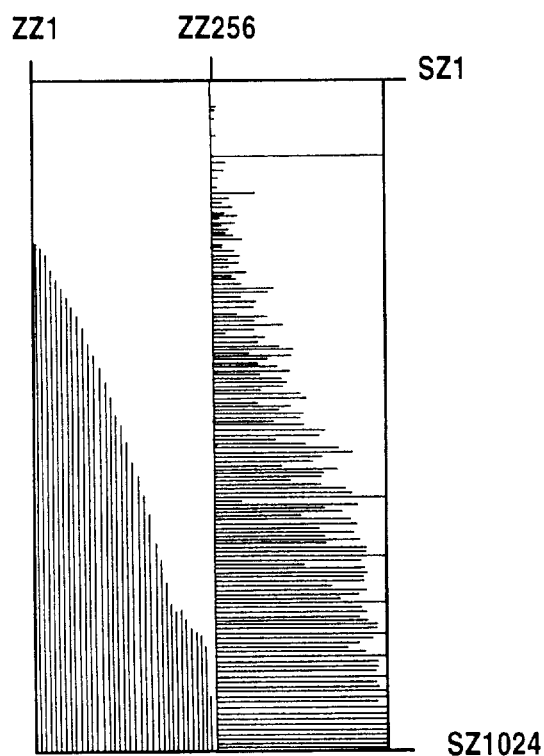
Figure 3D:
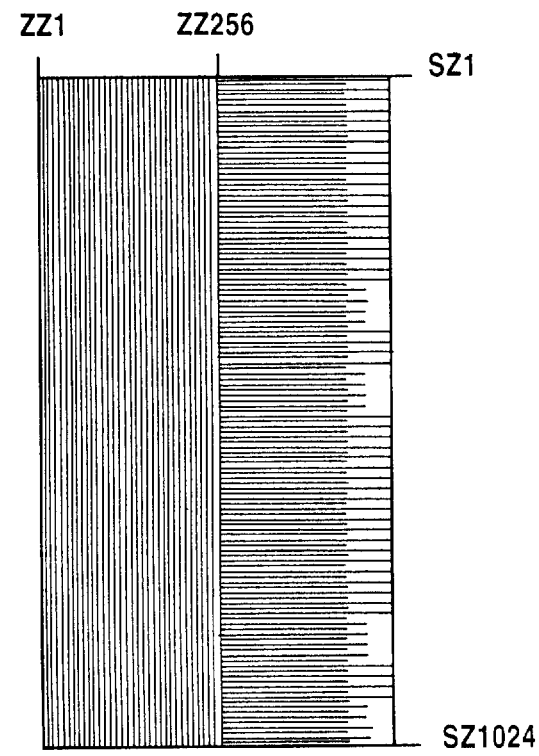
Figure 3E:
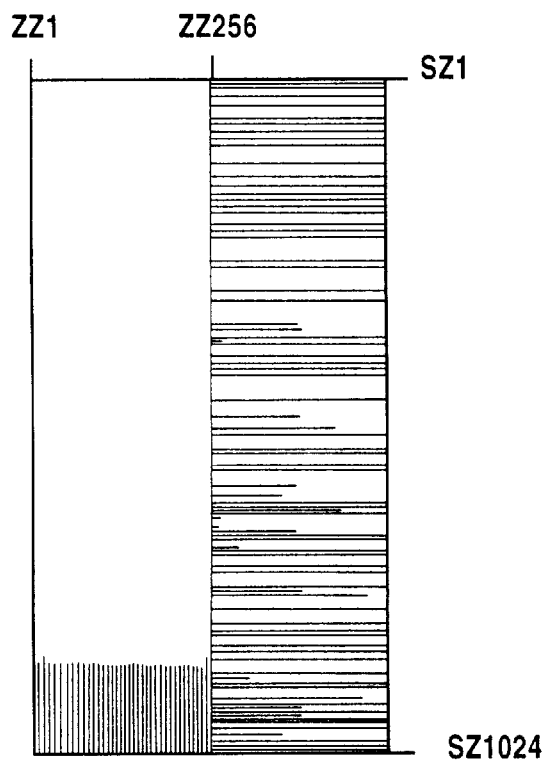
Figure 3F:
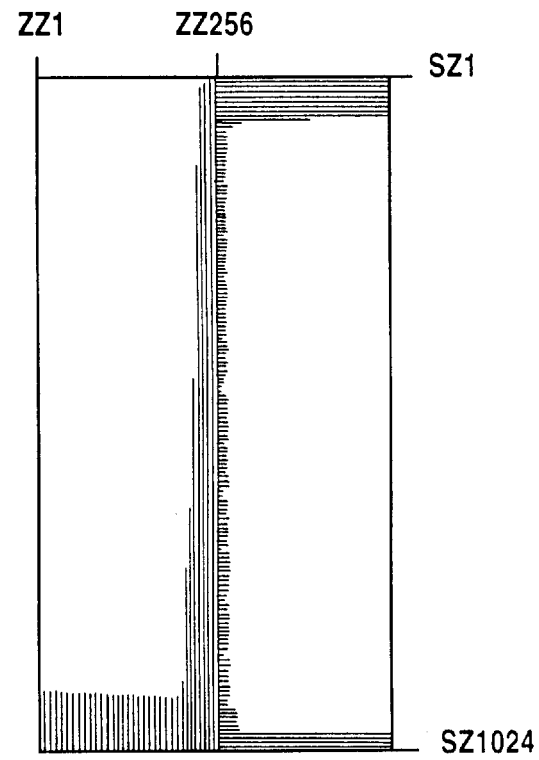

FIGS. 3A–3F show typical examples of "high-mass" failure patterns that occur in a physical block. Each figure includes two halves wherein the values of the column counters are plotted from SZ1 to SZ1024 on the right, and the values of the row counters are plotted from ZZ1 to ZZ256 on the left at the top. FIG. 3A shows a typical failure pattern with many intermediate-layer short circuits. This pattern can be assigned to class MILS (MILS stands for "many inter layer shorts"). FIG. 3B shows a failure pattern with periodically regularly spaced-apart bit line failures of the class BSDP (BSDP stands for "bitline same distance period"). FIG. 3C shows a failure pattern with a bit line chaos having a certain monotony of class BCM (BCM stands for "bitline chaos with monotony"). FIG. 3D shows a failure pattern with a regular course of the word line or bit line failures of class WMBM (WMBM stands for "word line pattern/bit line pattern"). FIG. 3E shows a typical failure pattern with bit line chaos in class BC (BC stands for "bitline chaos"). FIG. 3F shows a typical failure pattern with massive peripheral errors in class MRF (MRF stands for "massive peripheral errors"). The typical failure patterns shown represent some of the classes used to evaluate the failure mechanisms, whereas the actual number of such classes is typically about 70 or more.

After the above-described preparation of the raw data, the actual pattern classification is begun. As a function of the measured failure rate of a semiconductor chip, two different analysis methods are used: a first neural network NN1 for analyzing a defective physical block with respect to high-mass errors, and a second neural network NN2 for analyzing a defective physical block for errors of low error mass. The use of different methods as a function of the initially measured failure rate is performed with a view to the speed of analysis or optimizing of the classification outcomes that are ascertained. It should be taken into account that the use of a neural network, especially with large quantities of data, offers the advantage of considerably higher computation speed, but involves a considerable information loss. On the other hand, automatic pattern recognition by conventional methods entails a long computation time or a high rate of occupation of the computer, although more information can be obtained.

The method for analyzing the measured failure pattern will first be explained by referring to the flow chart of FIG. 4 while using the two different methods.

Figure 4:
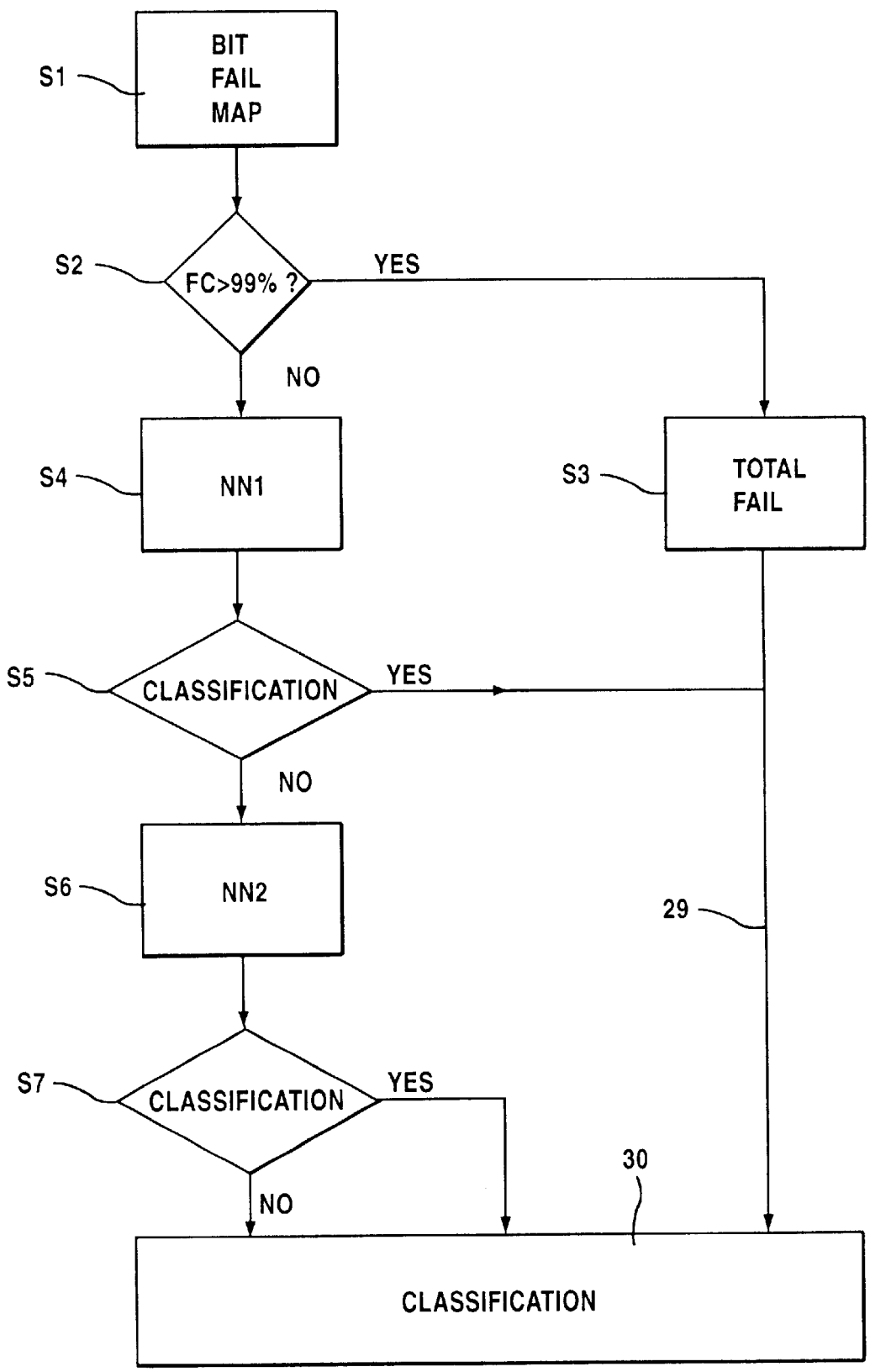
FIG. 4 is a flow chart used to explain a process sequence of a preferred exemplary embodiment of the invention.

In FIG. 4, in a step S1, first all of the raw data obtained from the measuring device are written into the computer 10, and the failure rate FC (FC stands for "fail count") of the ratio of defective memory cells to the total number is calculated. If in a step S2 the failure rate FC is determined to be greater than about 99%, then in a step S3 a total failure of the semiconductor chip is assumed, and the method proceeds through a branch 29 directly to an outcome segment 30 of the main program. If the failure rate FC in the step S2 is determined to be less than 99%, the program jumps to a step S4, in which an analysis of the failure patterns and classification are performed, using the first neural network NN1. If the classification is successful, the method proceeds through the branch 29 directly onto the segment 30 of the main program. If a classification is not possible in a step S5, then a fine analysis is again performed in a further branch. Specifically, in a step S6, an analysis and classification of the failure pattern is performed, using the second neural network NN2. If the classification of the failure patterns is successful, the method proceeds to the segment 30 of the main program, in which the ascertained category of the failure pattern is output. If a classification is not successful, this is determined in a step S7, and in a segment 30 a nonclassifiable category is output.

Function unit 2: First analysis of a defective physical block with respect to high-mass errors through the use of a first neural network.

After the preparation of the raw data, the attempt is first made to classify coarse defects. Coarse defects are understood to mean massive failures of the cell field with high error masses in the physical block. This part of the pattern recognition is accomplished with the aid of a trained first neural network NN1. The first neural network NN1 is not presented, for instance, with the 256 row counters and 1024 column counters directly as an input vector, but rather with a 27-dimension input vector, for instance, having components which are obtained from a number of subprocedures directly from the coordinate counters, and only from them. The 27 components of the input vector include the following values, which are normalized in the numerical range from −1 to +1:

bl, wl: proportion of lines having more than one predetermined proportion, for instance 90%, of failure bits on the corresponding line.

echo_bl, echo_wl: proportion of lines with more than 90% failure bits on the line; in this case lines must have echoes in corresponding physical blocks.

cm_bl, cm_wl: deviation from the center of distribution in the bit line and word line direction; the value toward −1 if most of the failure lines are located at the beginning of the physical block, toward +1 if most of the failure lines are located at the end of the physical block, and toward 0 if most of the failure lines are located in the vicinity of the middle of the physical block.

fl_bl, fl_wl: parameter for the fluctuations between adjacent lines; tends toward +1 if the failure pattern is chaotic and many lines are directly adjacent one other.

kz_bl, kz_wl: proportion of lines having fewer than 85% failure bits on the line.

mon_bl, mon_wl: parameter for a global monotonous distribution of cells in the failure pattern; tends toward −1 if the number of failure cells decreases from the beginning of a physical block to the end of the block, and toward +1 if the number of failure bits increases from the beginning of a physical block to the end of the block.

per_bl, per_wl: parameter for the periodicity of the failure pattern; tends toward +1 if the pattern is periodic and not very chaotic.

pure_bl, pure_wl: parameter for the equidistance of the failure lines in a periodic pattern; tends toward 0 if the periodicity is not equidistant and toward +1 if the periodicity is equidistant.

si_bl, si_wl: second moment of mass distribution; regardless of whether failure lines are located to the right or left of the middle of a physical block, this parameters tends toward +1 if the failures are located at the edges of the physical block, toward 0 if most of the failures are located in the vicinity of the middle of the physical block and toward 0.1 if failures are distributed uniformly within the physical block.

more_bl, more_wl: parameter for the number of larger groups in the bit line and word line directions; the value is raised by 0.1 for each larger group.

P32: proportion of lines which indicate short circuits in the bit line direction between layers.

mg_tot, mg_cmp: total mass of failure cells and their complements.

mrf: parameter for a so-called polished pattern; depending on the form of the pattern, has a tendency toward +1 or −1.

wl/bl: ratio between longer failure lines (greater than 90% failure bits) in the word line and bit line directions; tends toward −1 if more longer lines are present in the word line direction and toward +1 if more longer lines are present in the bit line direction.

In an actually measured failure pattern of a physical block, the components of the input vector that result on the basis of the calculated column and line counters are as follows, for example, for the first neural network:

| | |
|---|---|
| bl = 0.000 | wl = 0.000 |
| echo_bl = 0.000 | echo_wl = 0.000 |
| cm_bl = 0.095 | cm_wl = 0.695 |
| fl_bl = 0.019 | fl_wl = 0.019 |
| kz_bl = 1.000 | kz_wl = 1.000 |
| mon_bl = 0.281 | mon_wl = 0.531 |
| per_bl = 0.000 | per_wl = 0.000 |
| pure_bl = 0.000 | pure_wl = 0.000 |
| si_bl = 0.496 | si_wl = 0.705 |
| more_bl = 0.000 | more_wl = 0.000 |
| p32 = 0.000 | |
| mg_tot = 0.041 | mg_cmp = 0.959 |
| mrf = 0.071 | wl/bl = 0.000 |

Figure 5:
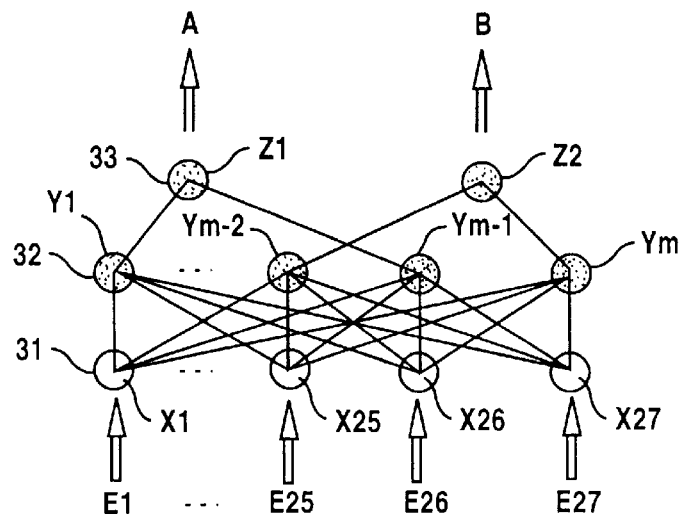
FIG. 5 is a diagrammatic view of an RCE network with three network layers.

The first neural network NN1, after the presentation of this input vector, decides which error class the failure belongs to, or releases the failure for further handling if the error class is not massive. An RCE-type configuration which is used as the first neural network NN1 has a basic mode of operation which will be explained in terms of a diagrammatic geometrical interpretation according to FIGS. 5 and 6 as well as FIGS. 7A and 7B. The RCE-type neural network NN1 implemented in the computer 10 has three layers as shown in FIG. 5: an input layer 31, a hidden layer 32 and an output layer 33. The input layer 31 has 27 processing elements X1 to X27, each of which is assigned to one component E1 to E27 of the 27-dimensional input vector. A plurality of processing elements Y1 to Ym of the hidden layer 32 is assigned to the processing elements X1 to X27 of the input layer 31. The number m of processing elements Y of the hidden layer 32 as a rule is greater than the dimension n of the input vector, and is dependent, for instance, on the complexity of the calculation and classification of the dot pattern to be analyzed. A 27-dimensional configuration of not necessarily cohesive space regions which is formed in the hidden layer 32, forms spatially complex decision regions.

Figure 6:
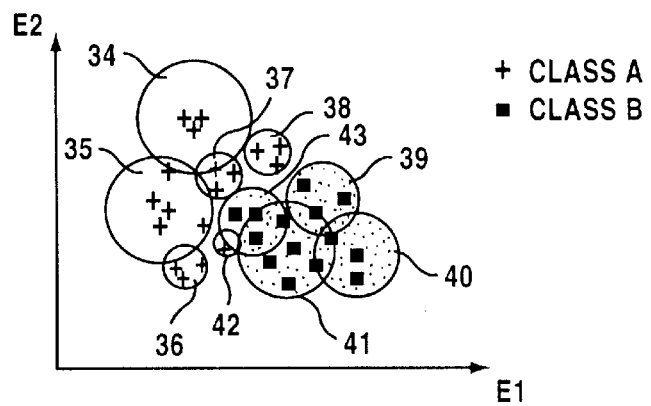
FIG. 6 is a diagrammatic view of an illustration used to explain a basic mode of operation of an RCE network using a geometrical interpretation.

In order to provide a geometrical interpretation of the mode of operation of the hidden layer 32 of the neural network NN1, a configuration of such space regions is shown in FIG. 6 in the form of hyperspheres in a two-dimensional space. To that end, a first component E1 of the input vector is shown on the right in FIG. 6 and a second component E2 of the input vector is shown at the top in FIG. 6. Inside the hidden layer 32, hyperspheres (which are simply circles in the illustrated two-dimensional case) that are formed from the two-dimensional components E1 and E2 of the input vector have center points which represent what in this case are the two dimensional coordinates of the input vector and have circular areas (which are space regions in the general case) that are formed from the values which are preset as a function of the training, in accordance with the desired classification. In FIG. 6, for the sake of simplicity, merely two classes A and B with the associated corresponding space regions are diagrammatically shown. For instance, circles or space regions 34, 35, 36, 37, 38 that are to be assigned to class A and circles or space regions 39, 40, 41, 42, 43 that are assigned to class B are shown. The configuration of the space regions, that is their center points and their respective length in the space, taking into account the assignment to a certain class, is defined after the training of the neural network on the basis of selected exemplary patterns. The space regions that belong to a certain class may readily be constructed as overlapping one another. In the hidden layer 32 of the neural network NN1, the 27-dimensional input vector input in the input layer 31 is assessed to find out which configuration of hyperspheres it belongs to, referred to a certain class. If such an assignment to a certain class can be made successfully, then in the output layer 33 assigned to the hidden layer 32, the correspondingly ascertained class is output. The number of outputs Z1 and Z2 of the output layer 33 essentially corresponds to the number of preset classes. In the schematic illustration provided by FIGS. 5 and 6, only two classes A and B and correspondingly two output elements Z1 and Z2 of the output layer 33 are shown. In reality, the number of classes and output elements is more than about 70 each.

Figure 7A:
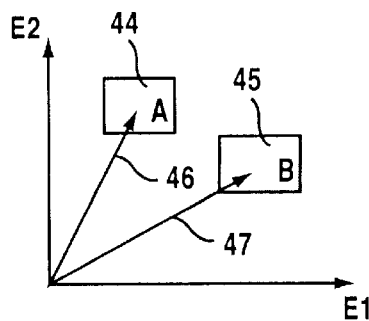
FIGS. 7A and 7B are schematic illustrations of two two-dimensional input vectors, in which a first vector is not located inside a space region of a second vector in a partial view of FIG. 7A, while the first vector is located inside the space region of the second vector in a partial view of FIG. 7B and accordingly a contraction of at least one space region is necessary.
Figure 7B:
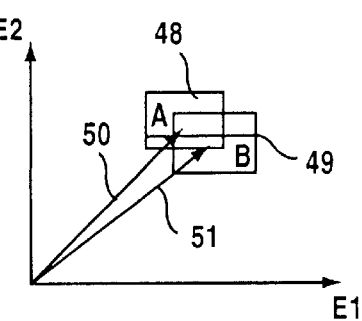

The space regions processed in the hidden layer 32 and located around each vector of the n-dimensional characteristic space need not necessarily have a spherical or radially symmetrical form. Instead, they may also be block-shaped, as shown in the schematic illustration which is restricted to two dimensions, in FIG. 7A and FIG. 7B. This drawing figure serves at the same time to illustrate in more detail the adaptation of the space regions in the training of the neural network. FIG. 7A shows the case where the space regions 44 and 45, each belonging to classes A and B, of the input vectors 46 an 47, do not overlap. In this case, an unambiguous assignment of a test vector, applied to the input layer 31 of the neural network, to a certain class A or B, is possible. By comparison, FIG. 7B illustrates the case of two overlapping space regions 48 and 49. In this case, in the training procedure of the neural network within the hidden layer 32, the space regions 48 and 49 associated with vectors 50 and 51 must be adapted or in other words contracted in such a way that no further overlap exists.

Function unit 3: Second analysis of a defective physical block for errors with low error mass, using a second neural network.

If the analysis of a defective physical block by the first neural network NN1 in the step S4 of FIG. 4 shows that a so-called nonmassive failure pattern is present, which the first neural network NN1 recognizes as such an error type without any detailed classification, then a second neural network NN2 is used for more-precise classification of the failure pattern.

In contrast to the analysis of high-mass errors, in which the components of the input vector for the first neural network NN1 can be said to be obtained by global observation of all of the word line and bit line counters, in a method step using the second neural network NN2 a segmentation of the counters is performed. To that end, the word line and bit line counters of a physical block are examined in more detail with respect to line-oriented failures as well as dot defects and clusters. What is sought in each case is the counter having the most failed cells. Where there are two failures of equal magnitude in both the word line and the bit line directions, the failure in the bit line direction is handled first. If the second neural network NN2 is capable of performing an unambiguous classification of the failure solely on the basis of the bit line information, then this is carried out without using information from the word line counters (which are set to dummy values of −1, for instance). If not, additional components of the input vector are obtained for the second neural network from individual groups of word line counters, and the entire input vector is presented to the network NN2 for evaluation. This is done successively until such time as the second neural network NN2 can either assign an error class learned from the training for the combined information from the word line and bit line directions, or no further information from the word line direction is present. In that case, a failure type that cannot be classified in further detail is output.

The components for what in particular is a 19-dimensional input vector for the second neural network are ascertained from the following values:

axis index for indicating the counter axis examined: for example, value 1 for the word line and value −1 for the bit line.
number of failure bits of the failure coordinates examined.
number of adjacent defective counters.
number of defective bits in the entire group.
number of defective bits in a first neighboring group.
number of defective bits in a second neighboring group.
number of defective bits in a third neighboring group.
dominant failure type on the counter axis examined: for example, −1 for both types, 0 for a "0" failure, and 1 for a "1" failure.
echo present: is set to value 1 if an echo is present in the corresponding physical block.
echo failure: is set to the value 1 if either the first or the second line is defective.
crossing error: is set to the value 1 if a singularity is found on the examined line.
fluctuation at the complementary counter.
number of defective bits on the line having the most failures of the complementary counter.
number of adjacent defective counters having failure bits.
number of error bits in this group.
distance from this first line to a second line having the second-most-frequent failures of the complementary counter, and if this distance is <4, the following additional components of the input vector are generated, and if not its values are set to −1.
number of failure bits on this second line.
number of adjacent defective counters having failure bits.
number of failure bits in this group.

The above-described procedure for the bit line direction applies analogously to the word line direction, if the more-massive of the two failures was found in the word line direction.

In this program portion for the second neural network NN2, recognized error classes are eliminated from the counters, and the algorithm described is continued until such time as no further errors for classification remain in the physical block. For instance, if the error classes MSB (many single bits), MDB (many double bits) or MCL (many clusters) are classified, then no elimination of the individual errors takes place, and the classification of the physical block is considered to be concluded.

Function unit 4: Checking whether or not significant distributions of individual error classes exist at certain wafer regions and simultaneously setting up the outcome data file.

After all of the chips on the wafer have been examined, the examination of possibly present special distributions of error classes over the entire wafer can be performed. To that end, a third neural network is trained with 22 different distributions of failure patterns on the wafer, which by way of example can include the following topographies: accumulation of defective chips over the entire periphery of the wafer or on the left or right edge of the wafer, accumulation of defective chips in the upper/lower peripheral region and upper/lower lateral peripheral region of the wafer, accumulation of defective chips in the region of the flat or antiflat of the wafer, accumulation of defective chips in a middle ring region of the wafer, and the like.

Distributions that, while striking, are not especially learned by the network are classified with a question mark by the third neural network. As a rule, this means either especially massive error classes over the entire wafer or massive clusters of errors of one error class, of the kind resulting, for instance, from mishandling on the wafers (scratches).

Through the use of the apparatus and the method according to the invention, it is successfully possible, using at least one neural network, to classify the failure patterns of a semiconductor memory chip with high reliability and replicability, and above all with short analysis times. FIG. 8 graphically shows the outcome of such a classification, referred to an entire wafer. The error classes are plotted on the right, and the respective frequency of the classes is indicated on the top in histogram bars. Such a classification makes it possible for professionals involved in producing semiconductor memory chips to find conclusive indications of the technology problems that cause failures in the production of the semiconductor memories.

I claim:

1. An apparatus for detecting and assessing a spatially discrete dot pattern disposed in a multidimensional coordinate system, in which each dot in the pattern assumes at least two differentiatable status values, the apparatus comprising:
   a measuring device for recording coordinate values and status values of each dot of a multidimensional spatial dot pattern;
   a memory associated with said measuring device for storing data corresponding to the recorded coordinate values and status values of each dot of the multidimensional spatial dot pattern;
   a computer associated with said memory for receiving the stored data, for determining a coordinate counter for each coordinate value of a coordinate axis from the stored data, and for forming a value of the coordinate counter from a number of detected dots of coordinates having a predetermined status value; and
   a neural network associated with said computer for receiving an n-dimensional input vector with components formed from the calculated coordinate counters of each dot of the spatially discrete dot pattern, for calculating an output vector by comparing the calculated input vector of the measured dot pattern with stored set-point vectors obtained on the basis of exemplary dot patterns, and for assigning a classification value of the measured dot pattern from the ascertained output vector and outputting the classification value, said neural network having three hidden layers.

2. The apparatus according to claim 1, wherein said three hidden layers are an input layer assigned to the input vector, an output layer assigned to the output vector, and a hidden layer disposed between said input layer and said output layer.

3. The apparatus according to claim 1, wherein at least one of the following numerical values are assigned to a respective one of n components of the n-dimensional input vector:
   a proportion of coordinate values having more than a predetermined number of dots of the dot pattern having a predetermined status value;
   a proportion of echo dots of dots of the dot pattern having a predetermined status value;
   a parameter of the fluctuations of dots of adjacent coordinate values of the dot pattern having a predetermined status value; and
   a proportion of coordinate values having fewer than a predetermined number of the corresponding coordinates of dots of the dot pattern having a predetermined status value.

4. The apparatus according to claim 1, wherein at least one of the following numerical values are assigned to a respective one of n components of the n-dimensional input vector:
   an equidistance of dots of the dot pattern having a predetermined status value in a periodic partial region of the dot pattern; and
   a number of at least partially cohesive partial regions of dots of the dot pattern having a predetermined status value in predetermined coordinate directions.

5. The apparatus according to claim 1, wherein numerical values assigned to n components of the n-dimensional input vector are normalized in a numerical range of numbers between −1 and +1.

6. An apparatus for detecting and assessing a spatially discrete dot pattern disposed in a multidimensional coordinate system, in which each dot in the pattern assumes at least two differentiatable status values, the apparatus comprising:
   a measuring device for recording coordinate values and status values of each dot of a multidimensional spatial dot pattern representing a failure pattern of a physically cohesive block of memory cells of a semiconductor memory of a plurality of semiconductor memories constructed on a main surface of a semiconductor wafer;
   a memory associated with said measuring device for storing data corresponding to the recorded coordinate values and status values of each dot of the multidimensional spatial dot pattern;
   a computer associated with said memory for receiving the stored data, for determining a coordinate counter for each coordinate value of a coordinate axis from the stored data, and for forming a value of the coordinate counter from a number of detected dots of coordinates having a predetermined status value; and
   a neural network associated with said computer for receiving an n-dimensional input vector with components formed from the calculated coordinate counters of each dot of the spatially discrete dot pattern, for calculating an output vector by comparing the calculated input vector of the measured dot pattern with stored set-point vectors obtained on the basis of exemplary dot patterns, and for assigning a classification value of the measured dot pattern from the ascertained output vector and outputting the classification value.

7. The apparatus according to claim 6, wherein each dot of the failure pattern has one of three status values, of which one status value is assigned to a "0" failure of the memory cell, one status value is assigned to a "1" failure of the memory cell, and one status value is assigned to a "0"-and-"1" failure of the memory cell.

8. The apparatus according to claim 6, wherein the semiconductor memory represents a 4-MBit memory with physically cohesive memory blocks, each made up of 256 rows and 1024 columns.

9. The apparatus according to claim 6, wherein the memory cells of the semiconductor memory constructed on the main surface of the semiconductor wafer are disposed in a matrix in bit lines or columns and in rows or word lines, and the coordinate counters have a column counter and a row counter.

10. The apparatus according to claim 6, wherein components of the n-dimensional input vector are assigned at least one of the following numerical values:
   a deviation from a center of distribution of failure cells of a physical block of the semiconductor memory having

19 a predetermined fail status in at least one of a bit line and word line direction;

a second moment of the mass distribution of failure cells of a physical block of the semiconductor memory with a predetermined fail status in at least one of the bit line and word line direction;

a parameter for a global monotonous distribution of failure cells of a physical block of the semiconductor memory having a predetermined fail state; and a parameter for a periodicity of the fail pattern of failure cells of a physical block of the semiconductor memory having a predetermined fail state.

11. The apparatus according to claim 6, wherein components of the n-dimensional input vector are assigned at least one of the following numerical values:

a proportion of at least one of bit lines and word lines of failure cells of a physical block of the semiconductor memory having a predetermined fail state with more than one specified first limit value on an affected row;

a proportion of at least one of bit lines and word lines of failure cells of a physical block of the semiconductor memory having a predetermined fail state with more than one specified second limit value on the affected row, wherein at least one of the affected word lines and bit lines have an echo in adjacent physical blocks;

a parameter for fluctuations of failure cells of a physical block of the semiconductor memory having a predetermined fail state between at least one of adjacent bit lines and adjacent word lines;

a proportion of at least one of bit lines and word lines having failure cells of a physical block of the semiconductor memory having a predetermined fail state with fewer than a third limit value of failure bits on at least one of the affected word line and bit line;

a parameter for equidistance of at least one of failure-tainted bit lines and word lines having a periodic pattern;

a parameter for a number of larger groups of failure cells in at least one of a bit line and word line direction;

a proportion of at least one of bit lines and word lines having intermediate-layer short circuits in at least one of the bit line and word line direction;

a total number of failure cells;

a parameter for failure cells occurring at an increased rate on a peripheral region of the wafer; and a ratio between at least one of longer failure-tainted word lines and bit lines in at least one of the bit line and word line direction.

12. The apparatus according to claim 6, wherein all of the semiconductor memories of a wafer are measured and examined by said measuring device, and said neural network outputs a classification of memory cell failure patterns applied to the entire wafer, from calculated output vectors of data of all of the physical blocks or all of the memory chips.

13. The apparatus according to claim 12, including wafer distributions in which the failure patterns of physical blocks of the memory cells are constructed at an increased rate at selected regions on the surface of the wafer, for training the neural network to make a classification of memory cell failure patterns applying to the entire wafer.

14. A method for detecting and assessing a spatially discrete dot pattern disposed in a multidimensional coordinate system, in which each dot in the pattern assumes at least two differentiatable status values, the method which comprises:

20 recording coordinate values and status values of each dot of a multidimensional spatial dot pattern with a measuring device;

storing in a memory data corresponding to the recorded coordinate values and status values of each dot of the multidimensional spatial dot pattern;

entering the stored data in a computer associated with the memory;

determining a coordinate counter for each coordinate value of a coordinate axis from the stored data with the computer, and forming a value of the coordinate counter from a number of detected dots of the coordinates having a predetermined status value;

forming n components of an n-dimensional input vector from the calculated coordinate counters of each dot of the spatially discrete dot pattern;

assigning at least one of the following numerical values to a respective one of n components of the n-dimensional input vector:

a proportion of coordinate values having more than a predetermined number of dots of the dot pattern having a predetermined status value;

a proportion of echo dots of dots of the dot pattern having a predetermined status value;

a parameter of fluctuations of dots of adjacent coordinate values of the dot pattern having a predetermined status value; and a proportion of coordinate values having fewer than a predetermined number of corresponding coordinates of dots of the dot pattern having a predetermined status value;

entering the n-dimensional input vector into a neural network;

calculating and outputting an output vector with the neural network by comparing the calculated input vector of the measured dot pattern with stored set-point vectors obtained on the basis of exemplary dot patterns; and assigning and outputting a classification value of the measured dot pattern from the output vector ascertained with the neural network.

15. A method for detecting and assessing a spatially discrete dot pattern disposed in a multidimensional coordinate system, in which each dot in the pattern assumes at least two differentiatable status values, the method which comprises:

recording coordinate values and status values of each dot of a multidimensional spatial dot pattern with a measuring device;

storing in a memory data corresponding to the recorded coordinate values and status values of each dot of the multidimensional spatial dot pattern;

entering the stored data in a computer associated with the memory;

determining a coordinate counter for each coordinate value of a coordinate axis from the stored data with the computer, and forming a value of the coordinate counter from a number of detected dots of the coordinates having a predetermined status value;

forming n components of an n-dimensional input vector from the calculated coordinate counters of each dot of the spatially discrete dot pattern;

assigning at least one of the following numerical values to a respective one of n components of the n-dimensional input vector:

an equidistance of dots of the dot pattern having a predetermined status value in a periodic partial region of the dot pattern; and a number of at least partially cohesive partial regions of dots of the dot pattern having a predetermined status value in predetermined coordinate directions;

entering the n-dimensional input vector into a neural network;

calculating and outputting an output vector with the neural network by comparing the calculated input vector of the measured dot pattern with stored set-point vectors obtained on the basis of exemplary dot patterns; and assigning and outputting a classification value of the measured dot pattern from the output vector ascertained with the neural network.

16. A method for detecting and assessing a spatially discrete dot pattern disposed in a multidimensional coordinate system, in which each dot in the pattern assumes at least two differentiatable status values, the method which comprises:

recording coordinate values and status values of each dot of a multidimensional spatial dot pattern with a measuring device;

storing in a memory data corresponding to the recorded coordinate values and status values of each dot of the multidimensional spatial dot pattern;

entering the stored data in a computer associated with the memory;

determining a coordinate counter for each coordinate value of a coordinate axis from the stored data with the computer, and forming a value of the coordinate counter from a number of detected dots of the coordinates having a predetermined status value;

forming n components of an n-dimensional input vector from the calculated coordinate counters of each dot of the spatially discrete dot pattern;

normalizing numerical values assigned to n components of the n-dimensional input vector in a numerical range of numbers between −1 and +1;

entering the n-dimensional input vector into a neural network;

calculating and outputting an output vector with the neural network by comparing the calculated input vector of the measured dot pattern with stored set-point vectors obtained on the basis of exemplary dot patterns; and assigning and outputting a classification value of the measured dot pattern from the output vector ascertained with the neural network.

17. A method for detecting and assessing a spatially discrete dot pattern disposed in a multidimensional coordinate system, in which each dot in the pattern assumes at least two differentiatable status values, the method which comprises:

recording coordinate values and status values of each dot of a multidimensional spatial dot pattern with a measuring device;

storing in a memory data corresponding to the recorded coordinate values and status values of each dot of the multidimensional spatial dot pattern;

entering the stored data in a computer associated with the memory;

determining a coordinate counter for each coordinate value of a coordinate axis from the stored data with the computer, and forming a value of the coordinate counter from a number of detected dots of the coordinates having a predetermined status value;

forming n components of an n-dimensional input vector from the calculated coordinate counters of each dot of the spatially discrete dot pattern;

entering the n-dimensional input vector into a neural network;

calculating and outputting an output vector with the neural network by comparing the calculated input vector of the measured dot pattern with stored set-point vectors obtained on the basis of exemplary dot patterns; and assigning and outputting a classification value of the measured dot pattern from the output vector ascertained with the neural network; and representing a failure pattern of a physically cohesive block of memory cells of a semiconductor memory of a plurality of semiconductor memories constructed on the main surface of a semiconductor wafer, with the dot pattern.

18. The method according to claim 17, which comprises assigning one of three status values to each dot of the failure pattern, of which one status value is assigned to a "0" failure of the memory cell, one status value is assigned to a "1" failure of the memory cell, and one status value is assigned to a "0" -and-"1" failure of the memory cell.

19. The method according to claim 17, which comprises representing a 4-MBit memory with physically cohesive memory blocks each made up of 256 rows and 1024 columns, with the semiconductor memory.

20. The method according to claim 17, which comprises placing the memory cells of the semiconductor memory constructed on the main surface of the semiconductor wafer in a matrix in bit lines or columns and in rows or word lines, and assigning a column counter and a row counter to the coordinate counters.

21. The method according to claim 17, which comprises assigning components of the n-dimensional input vector at least one of the following numerical values:

a deviation from a center of distribution of failure cells of a physical block of the semiconductor memory having a predetermined fail status in at least one of a bit line and word line direction;

a second moment of a mass distribution of failure cells of a physical block of the semiconductor memory with a predetermined fail status in at least one of the bit line and word line direction;

a parameter for a global monotonous distribution of failure cells of a physical block of the semiconductor memory having a predetermined fail state; and a parameter for a periodicity of the fail pattern of failure cells of a physical block of the semiconductor memory having a predetermined fail state.

22. The method according to claim 17, which comprises assigning the components of the n-dimensional input vector at least one of the following numerical values:

a proportion of at least one of bit lines and word lines of failure cells of a physical block of the semiconductor memory having a predetermined fail state with more than one specified first limit value on the affected row;

a proportion of at least one of bit lines and word lines of failure cells of a physical block of the semiconductor memory having a predetermined fail state with more than one specified second limit value on the affected row, wherein at least one of the affected word lines and bit lines have an echo in adjacent physical blocks;

a parameter for the fluctuations of failure cells of a physical block of the semiconductor memory having a predetermined fail state between at least one of adjacent bit lines and adjacent word lines;

a proportion of at least one of bit lines and word lines having failure cells of a physical block of the semiconductor memory having a predetermined fail state with fewer than a third limit value of failure bits on at least one of the affected word line and bit line;

a parameter for the equidistance of at least one of failure-tainted bit lines and word lines having a periodic pattern;

a parameter for a number of larger groups of failure cells in at least one of the bit line and word line direction;

a proportion of at least one of bit lines and word lines having intermediate-layer short circuits in at least one of the bit line and word line direction;

a total number of failure cells;

a parameter for failure cells occurring at an increased rate on a peripheral region of the wafer; and a ratio between at least one of longer failure-tainted word lines and bit lines in at least one of the bit line and word line direction.

23. The method according to claim 17, which comprises measuring and examining all of the semiconductor memories of a wafer with the measuring device, and outputting a classification of memory cell failure patterns applying to the entire wafer with the neural network from calculated output vectors of data of all of the physical blocks or all of the memory chips.

24. The method according to claim 23, which comprises training the neural network to make a classification of memory cell failure patterns applying to the entire wafer by providing wafer distributions in which failure patterns of physical blocks of the memory cells are constructed at an increased rate at selected regions on the surface of the wafer.

* * * * *

UNITED STATES PATENT AND TRADEMARK OFFICE
CERTIFICATE OF CORRECTION

PATENT NO. : 5,950,181
DATED : September 7, 1999
INVENTOR(S) : Peter Federl

It is certified that error appears in the above-identified patent and that said Letters Patent is hereby corrected as shown below:

On the Title Page, item [30] should read as follows:
--Jan. 4, 1996    [EU]    Europe....... 96 100 070.0--.

Signed and Sealed this

Twenty-sixth Day of December, 2000

Attest:

Q. TODD DICKINSON

Attesting Officer           Director of Patents and Trademarks